(12) United States Patent
Lee et al.

(10) Patent No.: US 6,583,008 B2
(45) Date of Patent: Jun. 24, 2003

(54) NONVOLATILE SEMICONDUCTOR MEMORY DEVICE AND MANUFACTURING METHOD THEREOF

(75) Inventors: Seong-soo Lee, Sungnam (KR); Jae-seung Hwang, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/253,133

(22) Filed: Sep. 24, 2002

(65) Prior Publication Data

US 2003/0022446 A1 Jan. 30, 2003

Related U.S. Application Data

(62) Division of application No. 09/735,864, filed on Dec. 13, 2000, now Pat. No. 6,483,146.

(30) Foreign Application Priority Data

Dec. 13, 1999 (KR) .............................................. 99-57206

(51) Int. Cl.[7] .............................................. H01L 29/788
(52) U.S. Cl. ...................... 438/257; 438/595; 438/593
(58) Field of Search .................................. 438/201, 211, 438/219, 225, 257, 266, 295, 297, 404, 439, 587, 595, 696, 778, FOR 187, FOR 199, FOR 203, 593

(56) References Cited

U.S. PATENT DOCUMENTS

| | | | | |
|---|---|---|---|---|
| 5,019,879 A | * | 5/1991 | Chiu | |
| 5,886,379 A | * | 3/1999 | Jeong | |
| 5,962,889 A | * | 10/1999 | Yamauchi et al. | |
| 5,973,353 A | * | 10/1999 | Yang et al. | |
| 6,015,984 A | * | 1/2000 | Leu | |
| 6,218,246 B1 | * | 4/2001 | Kwon | |
| 6,252,271 B1 | * | 6/2001 | Gambino et al. | |
| 6,309,926 B1 | * | 10/2001 | Bell et al. | |
| 6,380,035 B1 | * | 4/2002 | Sung et al. | |
| 6,380,582 B2 | * | 4/2002 | Camerlenghi et al. | |
| 6,486,508 B1 | * | 11/2002 | Lee | |

* cited by examiner

Primary Examiner—George Fourson
Assistant Examiner—Joannie Adelle Garcia
(74) Attorney, Agent, or Firm—Mills & Onello, LLP

(57) ABSTRACT

A floating gate electrode configuration and process reduces a space critical dimension between adjacent floating gate electrodes while reducing the consumption of a device isolation layer during etching of a dielectric layer overlying the floating gate electrode. The end portions of the floating gate electrode, which is formed separated on a device isolation region, have a step or rounded pattern. In order to realize such a pattern, after a first partial etch of a floating gate electrode material, polymer spacers or silicon nitride spacers are formed along the etched sidewalls. Then, using those spacers as an etching mask, a second etch is performed on the floating gate electrode material to separate the same. Furthermore, after forming polysilicon on the partially etched floating gate electrode material, blanket etching is performed on the polysilicon to form a floating gate electrode having a round pattern of end portions.

20 Claims, 10 Drawing Sheets

NONVOLATILE SEMICONDUCTOR MEMORY DEVICE AND MANUFACTURING METHOD THEREOF

This application is a division of application Ser. No 09/735,864, filed Dec. 13, 2000, now U.S. Pat. No. 6,483, 146.

BACKGROUND OF THE INVENTION

1. Field of the Invention

The present invention relates to a nonvolatile semiconductor memory device and manufacturing method thereof, and more particularly, to a flash memory device and manufacturing method thereof.

2. Description of the Related Art

Flash memory devices are classified generally as read only memory (ROM), and unlike random access memory (RAM) devices, they have non-volatility in which data stored in a memory cell can be retained when the power supply is removed. Flash memory devices also allow for high integration, so they are widely used in computer memory cards, etc. Unit cells of flash memory devices have basically the same structure as memory cells of other programmable ROM devices such as erasable programmable ROM (EPROM) or electrically erasable programmable ROM (EEPROM). Each unit cell of a flash memory device includes a cell transistor, that is, a tunnel oxide layer, a floating gate electrode, an intergate dielectric layer, and a control gate, which serves as a word line, all of which are sequentially stacked on a channel region.

FIG. 1 is a plan view showing the main portion of a cell array in a conventional flash memory device. FIG. 2 is a cross sectional view taken along line A–A' of FIG. 1, based on FIGS. 1 and 2D disclosed in Japanese Patent Hei 6-188431. Referring to FIGS. 1 and 2, a field oxide layer 14 for isolating an active region, in which a device is formed, as well as the devices themselves, is formed on a silicon substrate 10. Then, a gate oxide layer 12 is interposed to form a floating gate electrode 16 comprised of polysilicon, on top of which a dielectric layer 23 is interposed to form a control gate electrode 24 comprised of polysilicon continuously run in a plurality of memory devices. The dielectric layer 23 is, e.g., an oxide-nitride-oxide (ONO) layer having two oxide layers 18 and 22 sandwiching a nitride layer 20.

Referring to FIGS. 1 and 2, a memory device in the nonvolatile semiconductor memory device is arranged as follows. Active regions (not shown) of the device extend parallel to one another between the adjacent field oxide layers 14 along the longitudinal direction of the FIG. 1. The gate oxide layer 12, which is formed sufficiently thin to permit a charge tunneling, is interposed to form floating gate electrodes 16 in each unit cell of the memory device in a direction perpendicular to the active region. The floating gate electrodes 16 are separated from one another on the field oxide layer 14. The dielectric layer 23 is interposed on the separated floating gate electrode 16 to form the control gate 24 continuously run in a plurality of unit cells in the same direction to the floating gate electrode 16. The control gate electrode 24 serves as a word line of the memory device, and only two word lines are arranged to cross each field oxide layer 14 in FIG. 1.

Meanwhile, a bit line (not shown) goes over the active region, both of which are electrically connected through a contact 28 exposing the surface of the active region. A unit cell transistor is formed at the intersecting portion of the control gate electrode 24, which is a word line, and the active region. Reference numeral 30 denotes a drain region, which is formed in common between adjacent two unit cells, and reference numeral 32 denotes a source region. Reference numeral 26 denotes a separation region which separates the field oxide layers 14 and channel regions, respectively.

As shown in FIG. 2, the floating gate electrode 16 in the nonvolatile flash memory device is etched only on the field oxide layer 14 and separated from the adjacent floating gate electrodes 16 in the unit cell. The floating gate electrodes 16 have the same pattern within the memory cell of the nonvolatile memory device and are repetitively formed in each unit cell. The floating gate electrodes 16 are formed in such a way as to provide a sufficient coupling ratio (C/R). The coupling ratio is used for estimating the quantity of charges accumulated or removed after having been transmitted from a channel region of the silicon substrate 10 to these floating gate electrodes 16 via a gate oxide layer 12 by quantum-mechanical tunneling in each unit cell transistor.

FIG. 3 is a graph of illustrating relationship between a space critical dimension (CD) and a coupling ratio between adjacent floating gate electrodes in a conventional flash memory device. A space CD between the adjacent floating gate electrodes represents a distance between adjacent floating gate electrodes to be separated from each other on the field oxide layer. As the space CD is increased, the length of the floating gate is reduced, and accordingly, a coupling ratio is reduced. Conversely, as the space CD is reduced, the length of the floating gate is increased and a coupling ratio is increased. It can be seen from FIG. 3 that a space CD is inversely proportional to coupling ratio. Therefore, in order to secure a sufficient coupling ratio, a space CD must be maintained below a predetermined value.

FIG. 4 illustrates another problem that may occur if a space CD between the floating gate electrodes is large in the conventional nonvolatile flash memory device. More specifically, during the manufacture of a nonvolatile flash memory device, a gate oxide layer 12 is interposed on a substrate 10 to form a floating gate electrode 16 pattern, and then an intergate dielectric layer 23 is interposed on the entire surface of the substrate 10 to form a control gate electrode (not shown). In this case, in order to remove the ONO dielectric layer 23 formed on the sidewalls of the floating gate electrode 16, an etching target is increased, to etch and consume the field oxide layer 14 corresponding to about a thickness "H2" of the floating gate electrode 16 to a depth "H3", e.g., to a thickness of at least 800 Å.

Thus, as shown in FIG. 4, if the space CD "L3" between the adjacent floating gate electrodes 16, which are electrically separated from each other on the field oxide layer 14, is large, a difference between the space CD "L3", and a length "L2" corresponding to a ridge portion of the field oxide layer 14, the thickness of which is maintained uniform as "H1", is small, so that a margin against misalignment is not sufficiently provided in a photolithography process. For example, if misalignment occurs in a photolithography process for forming the floating gate electrode 16, a position on the field oxide layer 14, in which a material for the floating gate electrode 16 is etched, may be located on the edges of the field oxide layer 14 deviating from the ridge portion thereof. In this case, as described in the foregoing, because the field oxide layer 14 is consumed together in etching the ONO dielectric layer 23, the field oxide layer is almost removed on the edges thereof having a relatively small thickness, which significantly weakens isolation. Reference character "L1" in FIG. 4 denotes a horizontal distance of the field oxide layer 14.

As described above, in a process of forming a floating gate electrode in a nonvolatile flash memory device, a reduction in a space CD between floating gate electrodes is essentially required, for which the following conventional methods have been used.

FIGS. 5–11 are cross sectional views showing an example for a process of forming the floating gate electrode of the conventional flash memory device. Firstly, referring to FIG. 5, a filed oxide layer 14 and a gate oxide layer 12 are provided over a substrate 10 comprised of a semiconductor material such as silicon using a local oxidation of silicon (LOCOS) process which is widely known as an isolation method. After a floating gate electrode material 16 comprised of polysilicon, a first silicon nitride layer 40, and a first polysilicon layer 42 are sequentially formed on the entire surface of the substrate 10, a photoresist pattern 44a is formed by a usual photolithography technique.

Next, as shown in FIG. 6, a first polysilicon pattern 42a is formed by an etching process that uses the photoresist pattern 44a as an etching mask, and the residual photoresist pattern 44a is then removed as shown in FIG. 7. Subsequently, as shown in FIG. 8, a second polysilicon layer 46 is provided over the entire surface of the substrate 10, and blanket etchback of the second polysilicon layer 46 is performed to form second polysilicon spacers 46a on the sidewalls of the first polysilicon pattern 42a, as shown in FIG. 9. Then, using the second polysilicon spacers 46a as an etching mask, the exposed first silicon nitride layer 40 is etched to form a first silicon nitride pattern 40a.

For a subsequent process, a blanket etching process is performed to etch the floating gate electrode material 16 exposed by the first silicon nitride pattern 40a. In this case, the first polysilicon pattern 42a and the second polysilicon spacers 46a, which remain on the first silicon nitride pattern 40a, are etched together to leave a floating gate electrode 16a and the first silicon nitride pattern 40a. Next, the first silicon nitride pattern 40a is removed by phosphoric acid strip, thereby forming the final floating gate electrode 16a as shown in FIG. 11.

In the conventional method as above, since the second polysilicon spacers 46a are used as an etching mask, after development inspection (ADI) space CD measured with respect to the photoresist pattern 44a, which is formed after a developing process, is about 0.25 μm. However, after cleaning inspection (ACI) space CD, which is measured after forming the final floating gate electrode 16a, can be significantly reduced, thereby providing a sufficient coupling ratio and a sufficient process margin for the aforementioned misalignment.

However, the conventional method requires five deposition steps and three etching steps from the time when the floating gate electrode material 16 is formed on the substrate 10 underlying the field oxide layer 14 until when the final floating gate electrode 16a is formed. Thus, the processes are so complicated and require a long time, thereby increasing the manufacturing cost to drop a product yield rate. Furthermore, as shown in FIG. 11, because the sidewalls of the floating gate electrode 16a separated on the field oxide layer 14 are made vertical, in subsequent processes, i.e., ONO dielectric layer formation step and an etching process, the field oxide layer 14 is consumed to a thickness approximately corresponding to a thickness of the floating gate electrode 16a. Thus, as described above, if misalignment occurs, there is danger of greatly weakening isolation by the field oxide layer 14.

FIGS. 12–15 are cross sectional views showing another example of a process of forming a floating gate electrode in the conventional flash memory device. Initially, referring to FIG. 12, similarly as shown in FIG. 5, a field oxide layer 54 and a gate oxide layer 52 are formed on a substrate 50 comprised of a semiconducting material such as silicon by a LOCOS process which is a well-known isolation technique. After a floating gate electrode material 56 comprised of polysilicon, an anti-reflection layer 58 comprised of a silicon nitride layer are sequentially formed over the entire surface of the substrate 50, a photoresist pattern 60a is formed by a usual photolithography technique.

Next, as shown in FIG. 13, an anti-reflection pattern 58a and the underlying floating gate electrode 56a are formed by an etching process which uses the photoresist pattern 60a as an etching mask, and the residual photoresist pattern 60a is then removed by ashing/strip process. Subsequently, as shown in FIG. 14, a third polysilicon layer 62 is formed on the entire surface of the substrate 50, and then as shown in FIG. 15, blanket etchback of the third polysilicon layer 62 is performed to form third polysilicon spacers 62a along the sidewalls of the floating gate electrode 56a. Next, if the residual anti-reflection pattern 58a is removed, then the floating gate electrode 56a, on the sidewalls of which the third polysilicon spacers 62a are attached, are formed.

The conventional method above has an advantage in that a sufficient coupling ratio and a sufficient process margin for misalignment can be secured, because a space CD between the adjacent floating gate electrodes can be significantly reduced by using the third polysilicon spacers 62a. Furthermore, this method can greatly simplify a process. However, since a pattern of the floating gate electrode 56a comprised of polysilicon is exposed after it has been formed by an etching process, an oxide layer (not shown) can be formed on the exposed surface. Furthermore, since the third polysilicon layer 62 is formed on the oxide layer in a subsequent step of FIG. 14, the oxide fence, which is an insulating material, remains on the final floating gate electrode 56a, thus deteriorating electrical characteristics such as storage capacity of the floating gate electrode 56a.

SUMMARY OF THE INVENTION

To address the above limitations, it is an objective of the present invention to provide a nonvolatile semiconductor memory device having a shape which is capable of reducing a space critical dimension (CD) between adjacent floating gate electrodes separated on a device isolation layer as well as reducing consumption (etching-away) of the device isolation layer during etching of a dielectric layer formed on the floating gate electrode.

It is another objective to provide a method of manufacturing a nonvolatile semiconductor memory device capable of reducing a space CD between adjacent floating gate electrodes separated on a device isolation layer by a simplified process as well as reducing consumption of the device isolation layer in etching a dielectric layer formed on the floating gate electrode.

Accordingly, in order to achieve the first objective, the present invention provides a nonvolatile semiconductor memory device that includes a semiconductor substrate, a plurality of floating gate electrodes separated over the semiconductor substrate by interposing a gate insulating layer. The floating gate electrodes are separated in a device isolation region for isolating a plurality of memory cells arranged on the semiconductor substrate, and the end portions of the floating gate electrode, which are separated to oppose each other, have a step pattern.

The present invention also provides a nonvolatile semiconductor memory device that includes a semiconductor substrate, a plurality of floating gate electrodes which are formed separated over the semiconductor substrate, interposing a gate insulating layer. The floating gate electrodes are separated on a device isolation region for isolating a plurality of memory cells arranged on the semiconductor substrate, and the end portions of the floating gate electrode, which are separated to oppose each other, horizontally extend over the surface of the device isolation region, and includes projected portions having a rounded step pattern and overlying spacers having a round pattern continued from the round pattern of the projected portions, which are disposed between the projected portions and the sidewalls of the floating gate electrode.

In order to achieve the second objective, the present invention provides a method of manufacturing a nonvolatile semiconductor memory device that includes the steps of: forming a plurality of device isolation regions on a semiconductor substrate; forming a gate insulating layer on the entire surface of the semiconductor substrate; forming a floating gate electrode material on the entire surface of the resulting material; forming a photoresist pattern on the floating gate electrode material so that a portion of the floating gate electrode material overlying the device isolation region may be exposed; performing a first etch on the floating gate electrode material to a predetermined depth, using the photoresist pattern as an etching mask; forming polymer spacers on the etched sidewalls of the photoresist pattern and the floating gate electrode material; and performing a second etch on the floating gate electrode material so that the floating gate electrode material may be separated, using the photoresist pattern and the polymer spacers as an etching mask.

The present invention also provides a method of manufacturing a nonvolatile semiconductor memory device that includes the steps of: forming a plurality of device isolation regions on a semiconductor substrate; forming a gate insulating layer on the entire surface of the semiconductor substrate; forming a floating gate electrode material on the entire surface of the resulting material; forming an anti-reflection layer on the floating gate electrode material; forming a photoresist pattern on the floating gate electrode material so that a portion of the floating gate electrode material overlying the device isolation region may be exposed; performing a first etch on the floating gate electrode material to a predetermined depth, using the photoresist pattern as an etching mask; removing the photoresist pattern; forming a spacer material on the resulting material; etching back the spacer material to form spacers on the sidewalls of the floating gate electrode material undergoing the first etch; and performing a second etch on the floating gate electrode material so that the floating gate electrode material may be separated, using the residual anti-reflection layer and the spacers as an etching mask.

The present invention also provides a method of manufacturing a nonvolatile semiconductor memory device that includes the steps of: forming a plurality of device isolation regions on a semiconductor substrate; forming a gate insulating layer on the entire surface of the semiconductor substrate; forming a floating gate electrode material on the entire surface of the resulting material; forming an anti-reflection layer on the floating gate electrode material; forming a photoresist pattern on the floating gate electrode material so that a portion of the floating gate electrode material overlying the device isolation region may be exposed; performing a first etch on the floating gate electrode material to a predetermined depth, using the photoresist pattern as an etching mask; removing the photoresist pattern; forming a conductive material on the entire surface of the resulting material; and performing a second etch by etching back the conductive material and the underlying floating gate electrode material to separate the floating gate electrode material from one another.

Accordingly, the present invention can realize a nonvolatile semiconductor memory device which is capable of providing a sufficient coupling ratio by significantly reducing a space CD between adjacent floating gate electrodes since the sidewalls of floating gate electrode have a step or rounded spacer pattern while providing a sufficient process margin so that degradation in isolation due to misalignment can be prevented during a photolithography process.

Furthermore, the present invention can significantly reduce a space CD since the sidewalls of a floating gate electrode material can be formed by a second etching process to have a step or round spacer pattern, while securing a sufficient process margin so that degradation in isolation due to misalignment can be prevented during a photolithography process.

BRIEF DESCRIPTION OF THE DRAWINGS

The above objective(s) and advantages of the present invention will become more apparent by describing in detail a preferred embodiment thereof with reference to the attached drawings in which.

DETAILED DESCRIPTION OF THE INVENTION

First Embodiment

FIGS. 16–19 are cross sectional views taken in the direction of a control gate electrode, which operates as a word line, in a nonvolatile flash memory device. In the first place, a nonvolatile flash memory device according to a first embodiment of the present invention will now be described with reference to FIG. 19.

Figure 19:
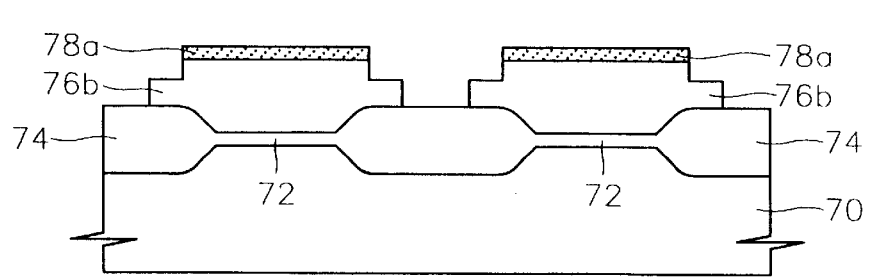

Referring to FIG. 19, a field oxide layer 74 is formed at regular intervals. A gate oxide layer 72, which is sufficiently thin so that quantum-mechanical tunneling may occur, is formed on a channel region disposed between the field oxide layers 74. A floating gate electrode 76b overlies the gate oxide layer 72 and extends over the surface of the field oxide layer 74 across the gate oxide layer 72 which is formed on the channel region. The sidewalls of the floating gate electrode 76b extending over the field oxide layer 74 have a step pattern. An anti-reflection pattern 78a which remains on the floating gate electrode 76b is removed in a subsequent process.

Figure 1:
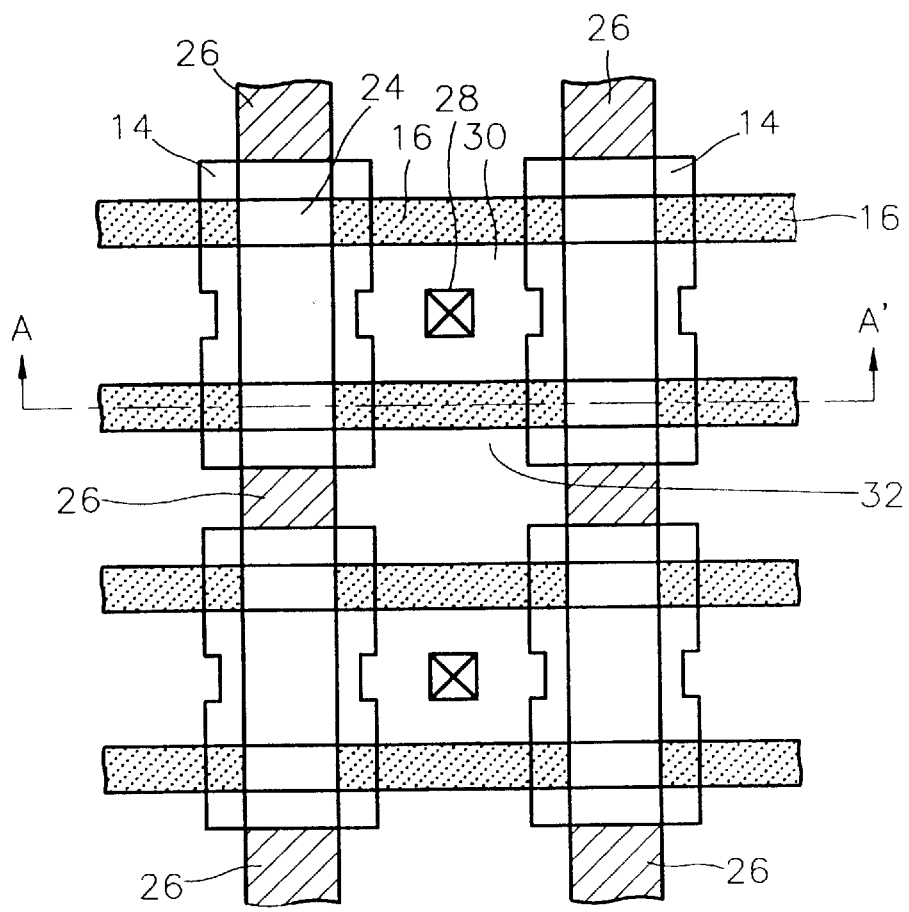
FIG. 1 is a plan view showing the main portion of a conventional flash semiconductor memory device.
Figure 2:
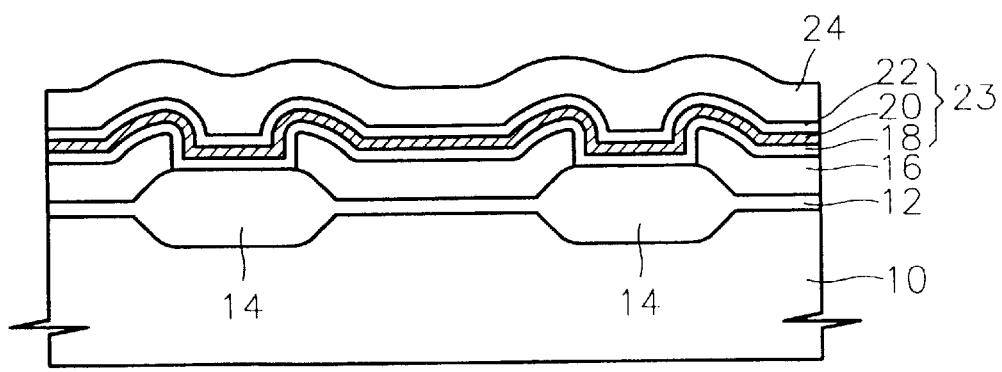
FIG. 2 is a cross sectional view of the conventional flash memory device taken along line A–A' of FIG. 1.
Figure 3:
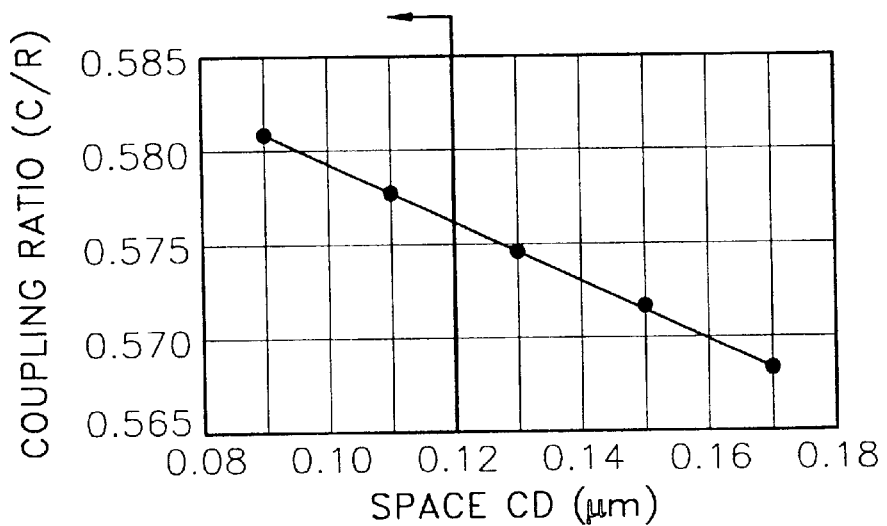
FIG. 3 is a graph showing the relationship between a space critical dimension (CD) between the floating gate electrodes of the conventional flash memory device, and a coupling ratio.
Figure 4:
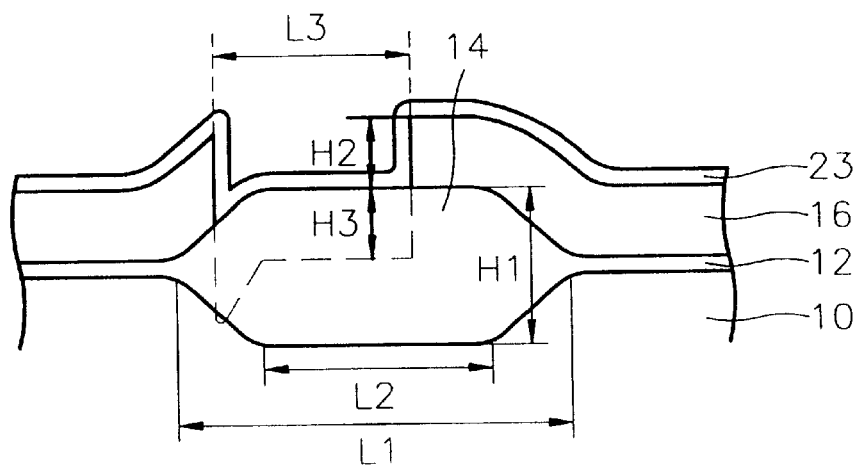
FIG. 4 illustrates a problem associated with a large space CD between the floating gate electrodes in the conventional flash memory device.
Figure 5:
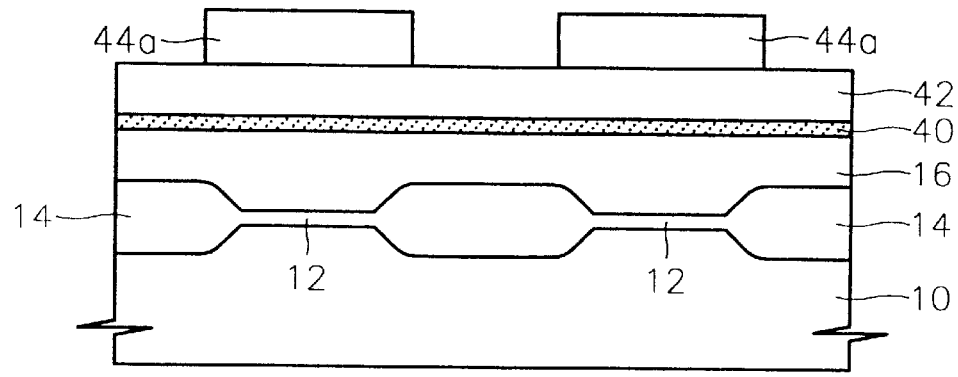
FIGS. 5–11 are cross sectional views showing a process of forming the floating gate electrode of the conventional flash memory device.
Figure 6:
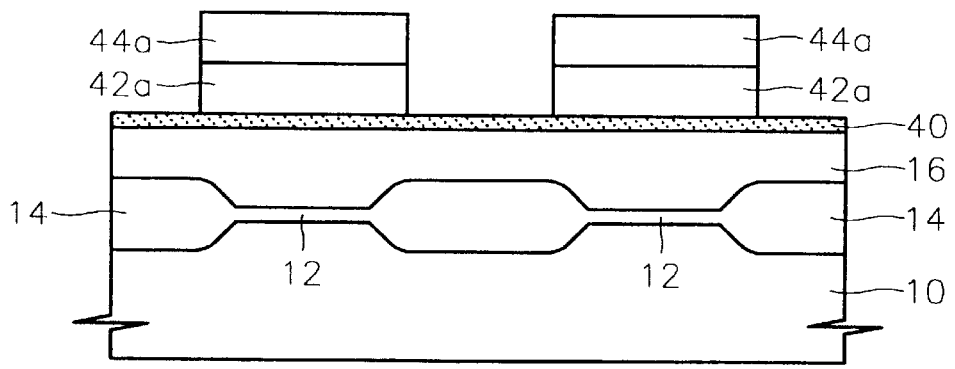
Figure 7:
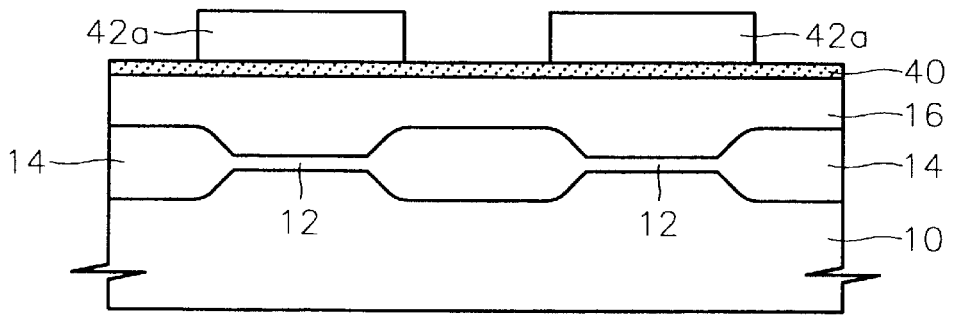
Figure 8:
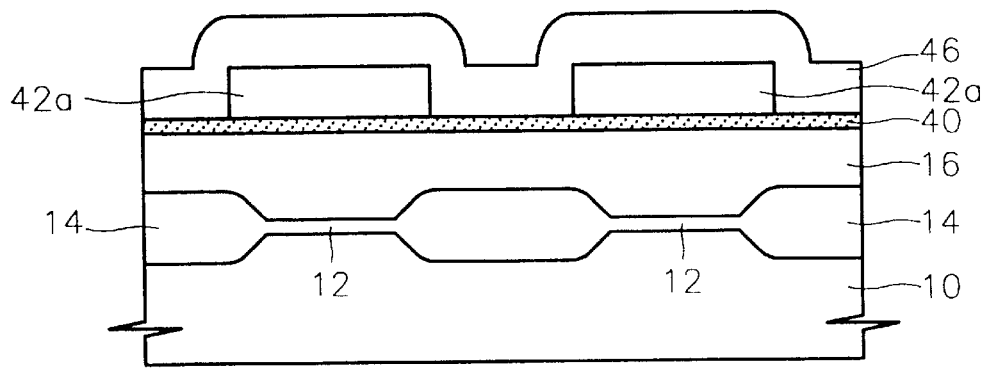
Figure 9:
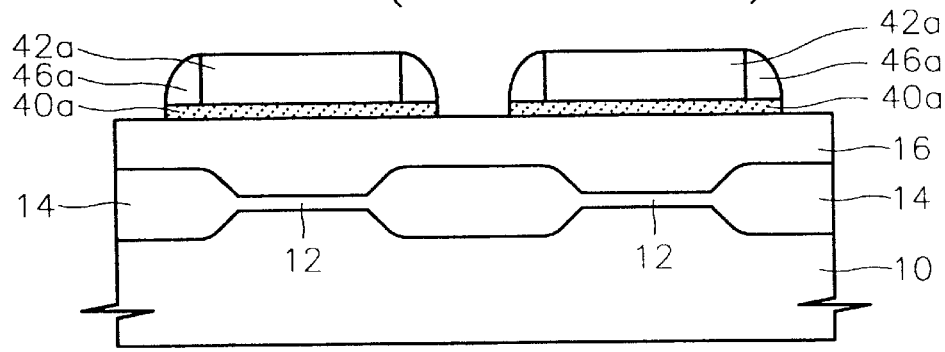
Figure 10:
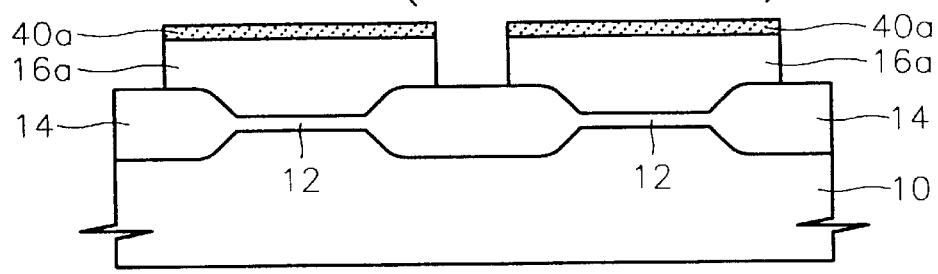
Figure 11:
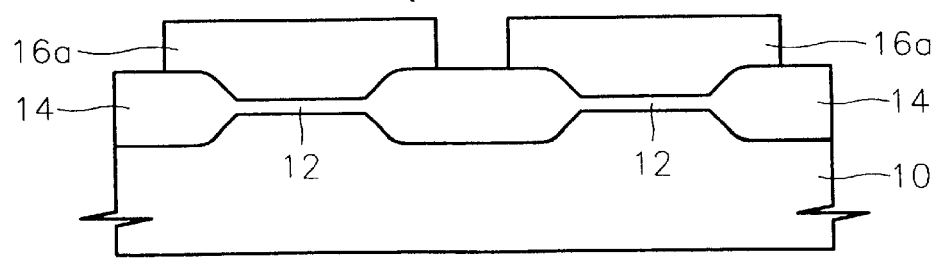
Figure 12:
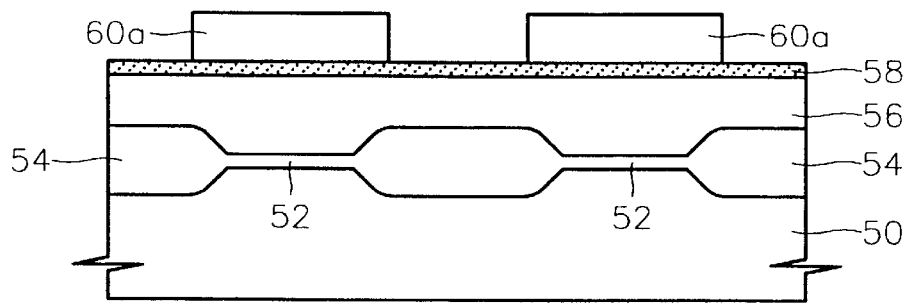
FIGS. 12–15 are cross sectional views showing another process of forming the floating gate electrode of the conventional flash memory device.
Figure 13:
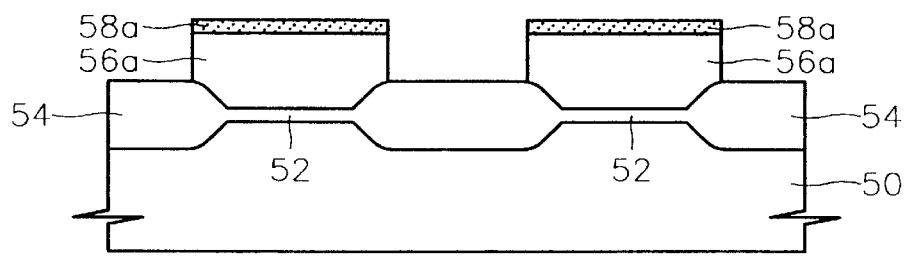
Figure 14:
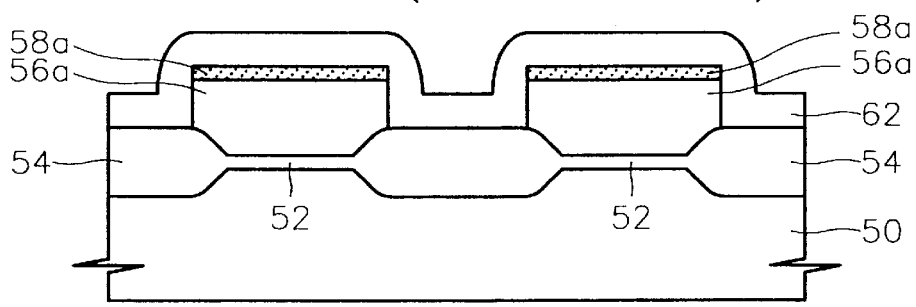
Figure 15:
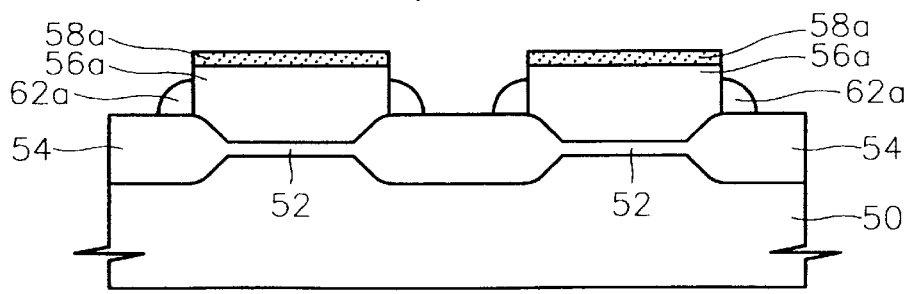

Since the sidewalls of each floating gate electrode 76b are of a step pattern, it can be seen that a space critical dimension (CD) is significantly reduced. The specific numerical value relates to a design matter, but for example, considering the coupling ratio of a floating gate electrode available from the graph of FIG. 3, the space CD is less than or equal to 0.12 μm, preferably, in the range of 0.06–0.12 μm. The floating gate electrode 76b is composed of a conductive material such as polysilicon, and after removal of the anti-reflection pattern 78a remaining on the floating gate electrode 76b, an oxide-nitride-oxide (ONO) layer, which is a dielectric layer, and a control gate electrode (not shown) are further provided. The step pattern in the end portions of the floating gate electrode 76b can be formed to substantially half the overall thickness thereof, but this also pertains to a design matter. For example, if the overall thickness of the floating gate electrode 76b is 2,000 Å, then the thickness of the step may be in the range of about 300–500 Å.

Figure 16:
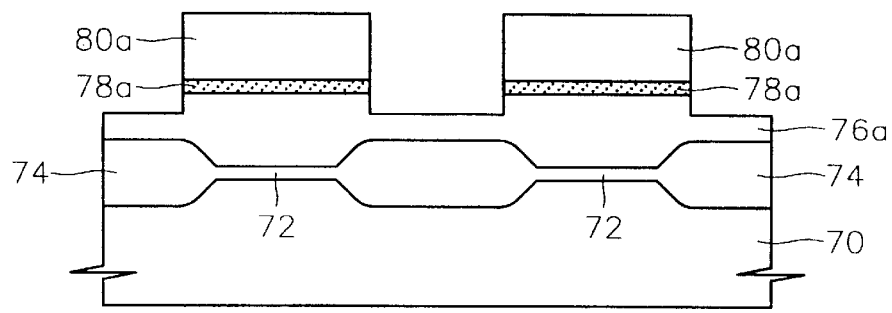
FIGS. 16–19 are cross sectional views showing a process of forming a floating gate electrode of a flash memory device according to a first embodiment of the present invention.

Next, a process of forming the floating gate electrode in the nonvolatile flash memory device according to the first embodiment of the invention will now be described with reference to FIGS. 16–19. Referring to FIG. 16, a field oxide layer 74 and a gate oxide layer 72 are formed on a substrate 70 comprised of a semiconducting material such as silicon, using a selective oxidation technique, namely, a local oxidation of silicon (LOCOS) process. Subsequently, a floating gate electrode material 76a comprised of polysilicon, an anti-reflection layer comprised of silicon nitride layer, and a photoresist layer are sequentially provided over the entire surface of the substrate 70. Next, a photoresist pattern 80a is formed through exposure and a developing process by a usual photolithography technique. Using the photoresist pattern 80a as an etching mask, an etching process is performed to partially etch away portions of the exposed anti-reflection layer and the floating gate electrode material, thereby forming an anti-reflection pattern 78a and a first floating gate electrode pattern 76a. In this case, a first etch removes the floating gate electrode material to be partially etched to substantially half the overall thickness thereof, but the etching amount is not restricted to this and may be above or below this.

Figure 17:
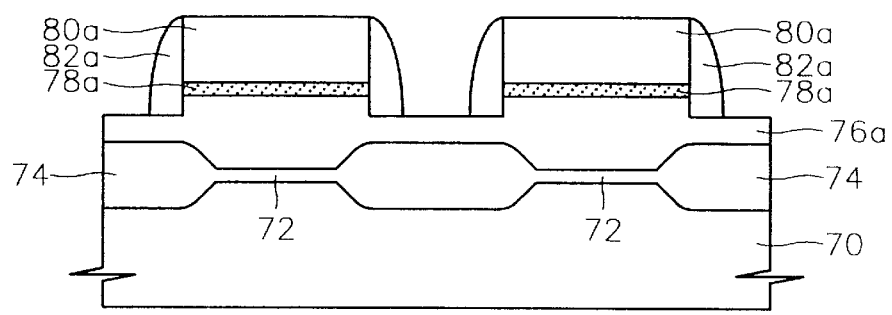

Next, referring to FIG. 17, a usual polymer formation process is performed in a polymer formation atmosphere, e.g., within a process chamber containing a fluorine gas, to form polymer spacers 82a on the sidewalls of the photoresist pattern 80a, anti-reflection pattern 78a, and the first floating gate electrode pattern 76a which is partially etched. The thickness of the polymer spacers 82a become a critical factor in determining the size of a space CD between floating gate electrodes in a subsequent process, and the thickness of the polymer spacers 82a can be controlled depending on the reaction time in the polymer formation process.

Figure 18:
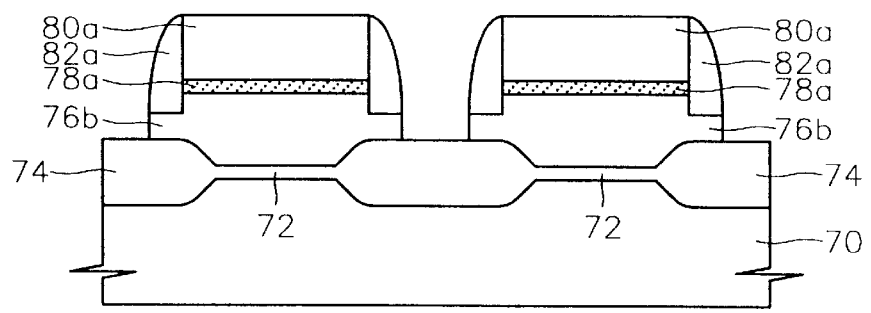

Next, referring to FIG. 18, using the photoresist pattern 80a and the polymer spacers 82a formed on the sidewalls of the photoresist pattern 80a as an etching mask, a second etch is performed on the exposed first floating gate electrode pattern 76a to expose the field oxide layer 74 and to form a separate floating gate electrode 76b.

Referring to FIG. 19, the photoresist pattern 80a, which serves as the etching mask, the anti-reflection pattern 78a, and the polymer spacers 82a are removed to form a floating gate electrode 76b, the sidewalls of which are of a step pattern. Subsequently, although it is not shown, after forming a dielectric layer and a conductive material for forming a control gate electrode over the entire surface of the substrate 70, subsequent processes for forming a nonvolatile flash memory device are performed.

Second Embodiment

FIGS. 20–24 are cross sectional views showing a process of forming a floating gate electrode of a flash memory device according to a second embodiment of the present invention. Like the first embodiment, the figures are sectioned in the direction of a control gate electrode, which is a word line, in a nonvolatile flash memory device. The same elements as shown in the first embodiment are denoted by the same reference numerals, and a detailed description will be omitted. At the outset, the nonvolatile flash memory according to the second embodiment of the present invention will now be described with reference to FIG. 24.

Figure 23:
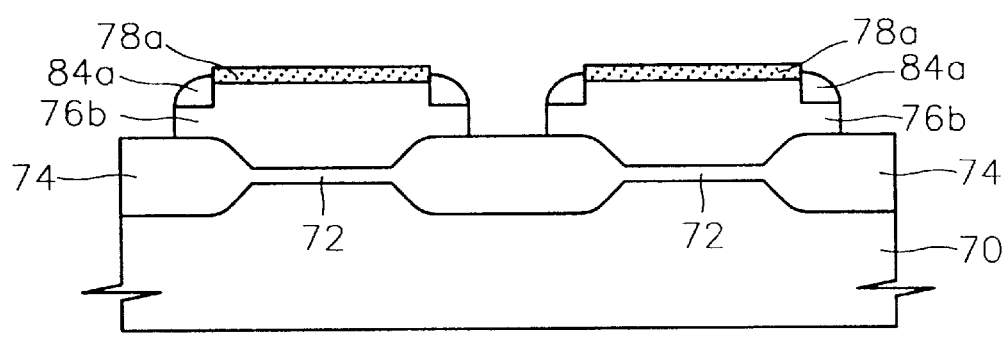
Figure 24:
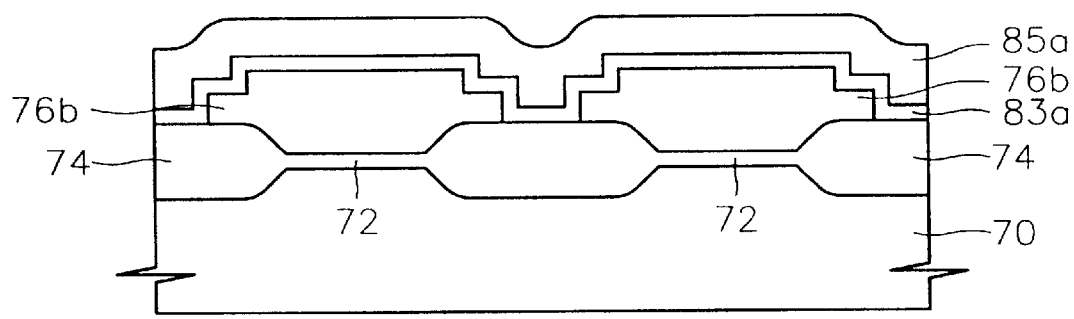

Referring to FIG. 24, a floating gate electrode 76b has the same structure as that shown in FIG. 19 associated with the first embodiment, and an ONO dielectric layer 83a and a control gate electrode 85a are sequentially formed on the floating gate electrode 76b. The length of a step pattern formed at the end portions of the sidewalls of the floating gate electrode 76b is controlled differently from the first embodiment, and the description will be given later. Next, a process of forming the floating gate electrode in the nonvolatile flash memory device according to the second embodiment of the invention will now be described with reference to FIGS. 20–24.

Figure 20:
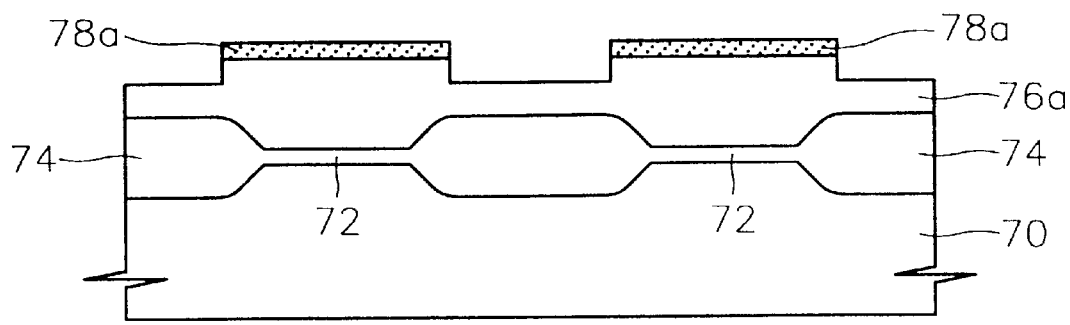
FIGS. 20–24 are cross sectional views showing a process of a floating gate electrode of a flash memory device according to a second embodiment of the present invention.

Referring to FIG. 20, as has been shown in FIG. 16, after a photoresist pattern 80a is formed on an anti-reflection layer, using the photoresist pattern 80a as an etching mask, an etching process is performed to the exposed anti-reflection layer and a portion of the floating gate electrode material to form an anti-reflection pattern 78a and a first floating gate electrode pattern 76a. However, unlike the first embodiment, the photoresist pattern 80a is removed at this point by a ashing/strip process.

Figure 21:
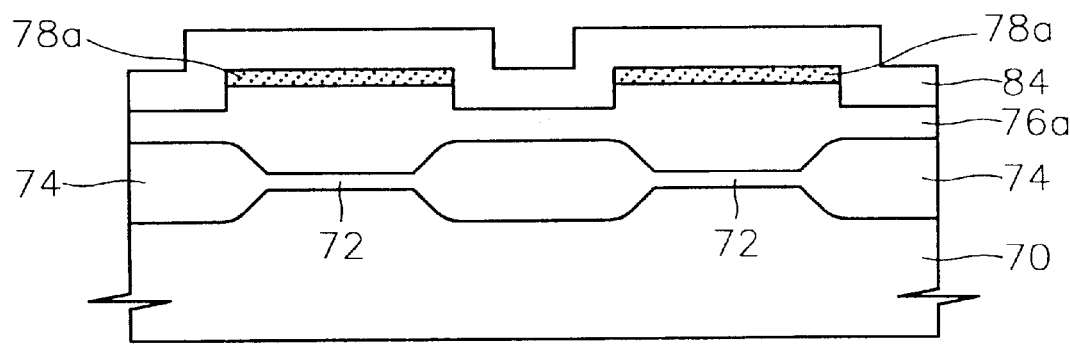

Next, referring to FIG. 21, a second silicon nitride layer 84 of nitride series is formed on the entire surface of the substrate 70 from which the photoresist pattern 80a has been removed. The second silicon nitride layer 84, which serve as spacers in a subsequent process, is formed to a thickness of at least 100 Å, although the thickness can very according to design application. Here, a nitride-series layer is used because the anti-reflection pattern 78a comprised of a nitride series material is stripped together with the second silicon nitride layer 84 by phosphoric acid. If spacers are formed using an oxide-series layer instead of the second silicon nitride layer 84, there is a danger of causing degradation in isolation since the exposed field oxide layer 74 is stripped together when removing the oxide spacers by a subsequent process.

Figure 22:
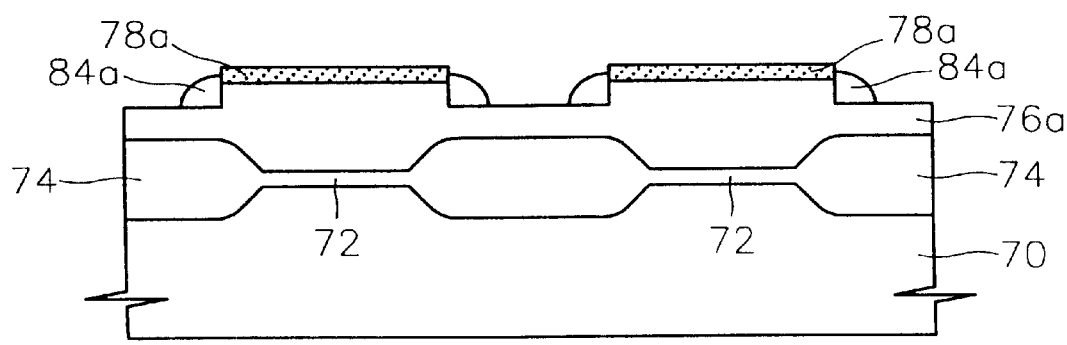

For a subsequent process, referring to FIG. 22, blanket etchback is performed on the second silicon nitride layer 84 to form second silicon nitride spacers 84*a* on the sidewalls of the anti-reflection pattern 78, followed by an etching process. Referring to FIG. 23, the exposed first floating gate electrode pattern 76*a* is etched away using the anti-reflection pattern 78*a* and the second silicon nitride spacers 84*a* as an etching mask to separate the first floating gate electrode 76*b*. Next, as previously described, if the anti-reflection pattern 78*a* and the second silicon nitride spacer 84*a* are removed by a phosphoric acid strip process, then the floating gate electrode 76*b* is formed as shown in FIG. 24. Next, after forming a dielectric layer 83*a* and a conductive material for forming a control gate electrode 85*a* on the entire surface of substrate 70, subsequent processes for forming a nonvolatile flash memory device are performed.

In the second embodiment, unlike the first embodiment, the thickness of spacers is determined depending on the thickness of the second silicon nitride layer 84, which in turn becomes a critical factor for determining the size of a space CD between the floating gate electrodes 76*b* in a subsequent process.

Figure 25:
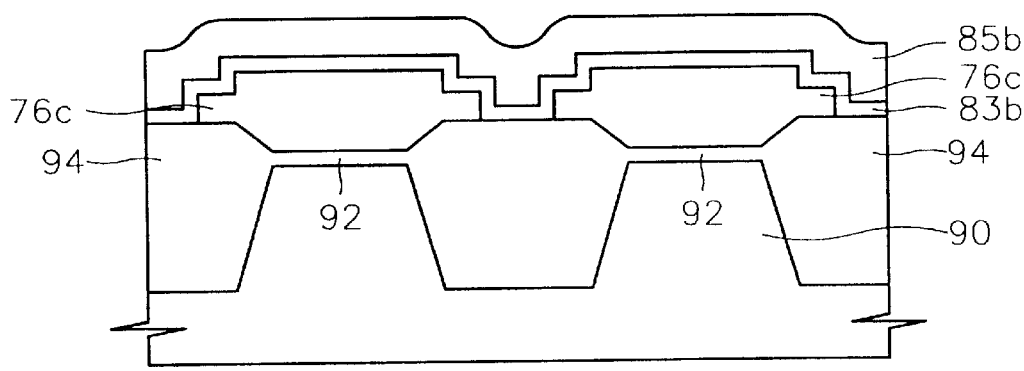
FIG. 25 is a cross sectional view of a floating gate electrode manufactured according to a third embodiment of the present invention.

FIG. 25 is a cross sectional view of a floating gate electrode of a flash memory device manufactured according to a modified example of the first and second embodiments of the present invention, wherein the floating gate electrode has a structure in which the floating gate electrode is separated on a trench oxide layer 94 having a shallow trench isolation (STI) structure. Referring to FIG. 25, a trench oxide layer 94 is formed on the surface of a semiconductor substrate 90 at regular intervals as a device isolation layer, and a gate oxide layer 92, which is sufficiently thin so as to permit a quantum-mechanical tunneling, is formed on a channel region positioned between the adjacent trench oxide layers 94. A floating gate electrode 76*c* overlying the gate oxide layer 92 extends over the surface of the trench oxide layer 94 across the gate oxide layer 92 formed on the channel region. The sidewalls of the floating gate electrode extending over the surface of the trench oxide layer 94 have a step pattern. On the floating gate electrode 76*c* are sequentially formed an ONO dielectric layer 83*b* and a control gate electrode 85*b*.

The floating gate electrode 76*c* shown in FIG. 25 is similar in the first and second embodiments, but it has an advantage in that the trench oxide layer is used to provide a sufficient process margin for misalignment.

Third Embodiment

FIGS. 26–29 are cross sectional views showing a process of a floating gate electrode of a flash memory device according to a third embodiment of the present invention. Like the first and second embodiments, the figures are taken in the direction of a control gate electrode, which is a word line, in a nonvolatile flash memory device. Furthermore, the third embodiment uses the trench oxide layer 94 as a device isolation layer as shown in FIG. 25, and the same elements as shown in FIG. 25 are denoted by the same reference numerals, and a detailed description will be omitted. Initially, the nonvolatile flash memory according to the third embodiment of the present invention will now be described with reference to FIG. 29.

Figure 29:
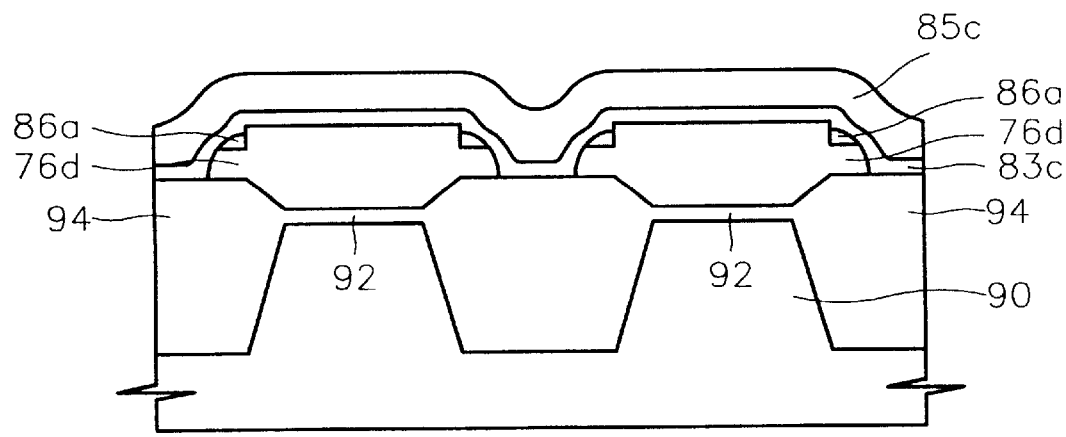

Referring to FIG. 29, a floating gate electrode 76*d*+86*a* have a different pattern from that described in association with the first and second embodiments. More specifically, the floating gate electrode 76*d*+86*a* in the nonvolatile flash memory device according to the third embodiment is separated on a trench oxide layer 94 which is a device isolation region for isolating a plurality of memory cells arranged on a semiconductor substrate 90. The end portions of the floating gate electrode 76*d*+86*a*, which are separated to oppose each other, are not of a step pattern like the first and second embodiments. The end portion horizontally extends over the surface of the trench oxide layer 94 from a predetermined height of the floating gate electrode 76*d*+86*a*, and furthermore, consists of a projected portion having a rounded step pattern and the overlying fourth polysilicon spacer 86*a* having a round pattern which is disposed between the projected portion and the sidewall of the floating gate electrode 76*d*+86*a*. In this case, the round pattern of the fourth polysilicon spacer 86*a* is continued from the round pattern of the projected portions. Thus, the overall end portions are of a round pattern. An ONO dielectric layer 83*c* and a control gate electrode 85*c* are sequentially formed on the floating gate electrode 76*d*+86*a*.

Figure 26:
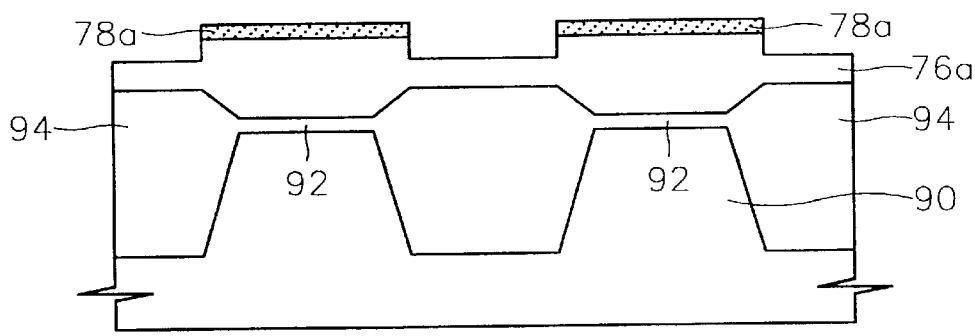
FIGS. 26–29 are cross sectional views showing a process of forming the floating gate electrode of the flash memory device according to the third embodiment of the present invention.

Next, a process of forming the floating gate electrode in the nonvolatile flash memory device according to the third embodiment of the present invention will now be described with reference to FIGS. 26–29. Referring to FIG. 26, as has been shown in FIG. 25, a floating gate electrode material and an anti-reflection layer are sequentially formed on a trench oxide layer 94 and a gate oxide layer 92, and a photoresist pattern (not shown) is then formed. Using the photoresist pattern as an etching mask, an etch process is performed to etch the exposed the anti-reflection layer and a portion of the floating gate electrode material to form an anti-reflection pattern 78*a* and a first floating gate electrode pattern 76*a*. Then, the photoresist pattern is removed by an ashing/strip process.

Figure 27:
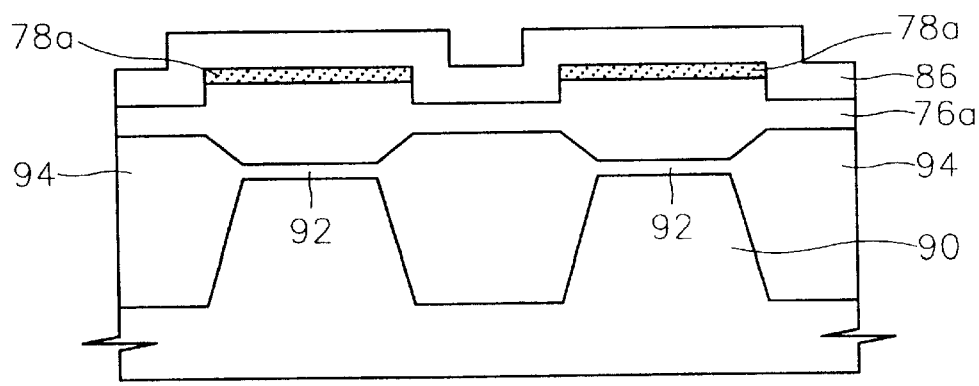
Figure 28:
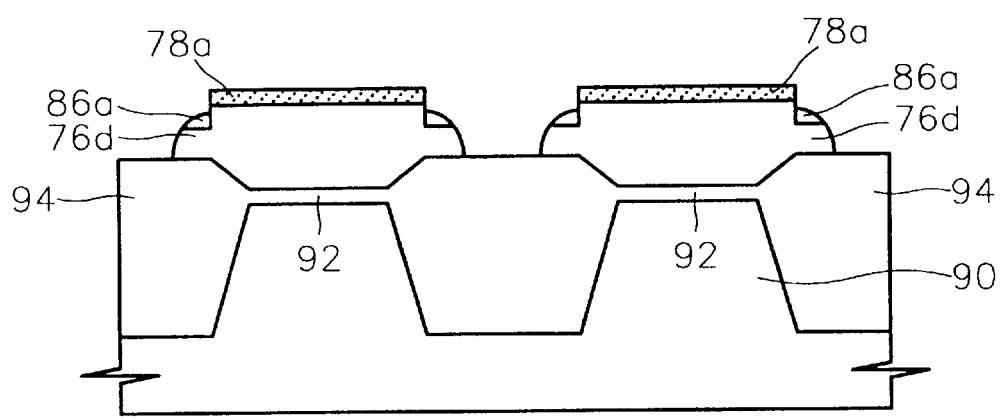

Subsequently, referring to FIG. 27, a fourth polysilicon layer 86 is formed on the entire surface of the semiconductor substrate 90 from which the photoresist pattern has been removed. Then, referring to FIG. 28, after blanket etchback of the fourth polysilicon layer 86, the first floating gate electrode pattern 76*a* is separated to form a floating gate electrode 76*d*+86*a*. In this case, the end portions of thus separated floating gate electrode 76*d*+86*a* have a rounded spacer pattern. More particularly, the end portion originating from the first floating gate electrode pattern 76*a* consists of a rounded projected portion and the overlying rounded spacer. The round pattern of the spacer originating from the fourth polysilicon layer 86 is continued from the projected portion. In the third embodiment, a space CD between the adjacent floating gate electrodes 76*d*+86*a* is controlled by adjusting the thickness of the fourth polysilicon layer 86.

Next, if the residual anti-reflection pattern 78*a* is removed by a phosphoric acid strip, then a floating gate electrode is formed as shown in FIG. 29. Following this, although it is not shown, a dielectric layer 83*c* and a conductive material for forming a control gate electrode 85*c* are formed on the entire surface of the semiconductor substrate 90, and then the subsequent processes for forming a nonvolatile flash memory device are performed.

The illustrated embodiments are only examples, and it will be understood by those skilled in the art that various changes in form-and details such as quality of material, numerical value, deposition or etching technique for each element, may be made therein.

The present invention reduces a space CD between adjacent floating gate electrodes to provide a sufficient coupling ratio, while realizing a floating gate electrode by a simple process. In this case, the end portion of the floating gate electrode has a step or round pattern so that consumption of a device isolation layer can be reduced in etching a dielectric layer formed on the floating gate electrode. Furthermore, the present invention can freely control a space CD between adjacent floating gate electrodes, while preventing an oxide fence within the floating gate electrode which the conventional method have to improve reliability of a device.

What is claimed is:

1. A method of manufacturing a nonvolatile semiconductor memory device, the method comprising the steps of:

forming a plurality of device isolation regions on a semiconductor substrate;

forming a gate insulating layer on the entire surface of the semiconductor substrate;

forming a floating gate electrode material on the entire surface of the resulting material;

forming a photoresist pattern on the floating gate electrode material so that a portion of the floating gate electrode material overlying the device isolation region is exposed;

performing a first etch on the floating gate electrode material to a depth, using the photoresist pattern as an etching mask;

forming polymer spacers on etched sidewalls of the photoresist pattern and the floating gate electrode material; and performing a second etch on the floating gate electrode material so that the floating gate electrode material is separated, using the photoresist pattern and the polymer spacers as an etching mask.

2. The method of claim 1, further comprising the steps of:

removing the photoresist pattern and the polymer spacers after performing the second etch on the floating gate electrode material;

forming a dielectric layer on the resulting material; and forming a control gate electrode material on the dielectric layer.

3. The method of claim 1, before forming the photoresist pattern, further comprising the step of forming an anti-reflection layer on the floating gate electrode material, wherein the photoresist pattern is formed so that a portion of the anti-reflection layer on the device isolation region is exposed.

4. The method of claim 1, wherein the device isolation region is a field oxide layer.

5. The method of claim 1, wherein the device isolation region has a shallow trench isolation structure.

6. The method of claim 1, wherein the first etch step on the floating gate electrode material is performed to half the overall thickness of the floating gate electrode.

7. The method of claim 1, wherein side thickness of the polymer spacers is controlled so that a space critical dimension between the adjacent floating gate electrode materials which are separated on the device isolation region is in the range of 0.06–0.12 $\mu$m.

8. The method of claim 2, wherein the dielectric layer is an oxide-nitride-oxide layer.

9. A method of manufacturing a nonvolatile semiconductor memory device, the method comprising the steps of:

forming a plurality of device isolation regions on a semiconductor substrate;

forming a gate insulating layer on the entire surface of the semiconductor substrate;

forming a floating gate electrode material on the entire surface of the resulting material;

forming an anti-reflection layer on the floating gate electrode material;

forming a photoresist pattern on the floating gate electrode material so that a portion of the floating gate electrode material overlying the device isolation region is exposed;

performing a first etch on the floating gate electrode material to a depth, using the photoresist pattern as an etching mask;

removing the photoresist pattern;

forming a spacer material on the resulting material;

etching back the spacer material to form spacers on sidewalls of the floating gate electrode material undergoing the first etch; and performing a second etch on the floating gate electrode material so that the floating gate electrode material is separated, using the residual anti-reflection layer and the spacers as an etching mask.

10. The method of claim 9, further comprising the steps of:

removing the anti-reflection layer and the spacers after performing the second etch on the floating gate electrode material;

forming a dielectric layer on the entire surface of the resulting material; and forming a control gate electrode material on the dielectric layer.

11. The method of claim 9, wherein the first etch step on the floating gate electrode material is performed to half the overall thickness of the floating gate electrode.

12. The method of claim 9, wherein side thickness of the spacers is controlled so that a space critical dimension between the adjacent floating gate electrode materials which are separated on the device isolation region is in the range of 0.06–0.12 $\mu$m.

13. The method of claim 9, wherein the spacers are comprised of a silicon nitride-series material.

14. The method of claim 13, wherein the anti-reflection layer and the spacers are removed by a phosphoric acid strip.

15. A method of manufacturing a nonvolatile semiconductor memory device, the method comprising the steps of:

forming a plurality of device isolation regions on a semiconductor substrate;

forming a gate insulating layer on the entire surface of the semiconductor substrate;

forming a floating gate electrode material on the entire surface of the resulting material;

forming an anti-reflection layer on the floating gate electrode material;

forming a photoresist pattern on the floating gate electrode material so that a portion of the floating gate electrode material overlying the device isolation region is exposed;

performing a first etch on the floating gate electrode material to a depth, using the photoresist pattern as an etching mask;

removing the photoresist pattern;

forming a conductive material on the entire surface of the resulting material; and performing a second etch by etching back the conductive material and the underlying floating gate electrode material to separate the floating gate electrode material from one another.

16. The method claim 15, further comprising the steps of:

removing the anti-reflection layer after performing the second etch on the floating gate electrode material;

forming a dielectric layer on the entire surface of the resulting material; and forming a control gate electrode material on the dielectric layer.

17. The method of claim 15, wherein the first etch step on the floating gate electrode material is performed to etch half the overall thickness of the floating gate electrode material.

18. The method of claim 15, wherein the thickness of the conductive material is controlled so that a space critical dimension between the adjacent floating gate electrode materials which are separated on the device isolation region is in the range of 0.06–0.12 $\mu$m.

19. The method of claim 15, wherein the conductive material is the same as the floating gate electrode material.

20. The method of claim 15, wherein the conductive material is different from the floating gate electrode material.

* * * * *